United States Patent [19]  [11] 4,440,107
Doehler et al.  [45] Apr. 3, 1984

[54] MAGNETIC APPARATUS FOR REDUCING SUBSTRATE WARPAGE

[75] Inventors: Joachim Doehler, Union Lake; Vincent Cannella, Detroit, both of Mich.; Richard O. Gray, Jr., Glen Ellyn, Ill.

[73] Assignee: Energy Conversion Devices, Inc., Troy, Mich.

[21] Appl. No.: 397,190

[22] Filed: Jul. 12, 1982

[51] Int. Cl.³ .............................................. C23C 13/10
[52] U.S. Cl. ................................... 118/718; 118/719; 118/723; 118/730; 118/722; 118/50.1; 427/47; 427/255.5
[58] Field of Search ............... 118/722, 623, 719, 729, 118/723, 730, 718, 50.1; 427/255.5, 47

[56] References Cited

U.S. PATENT DOCUMENTS

| 2,731,212 | 1/1956 | Baker | 226/93 X |
| 2,925,062 | 2/1960 | Schwindt | 118/719 X |
| 3,661,116 | 5/1972 | Moskowitz et al. | 226/93 X |
| 3,898,952 | 8/1975 | Shirahata et al. | 118/718 |
| 3,924,563 | 12/1975 | Kessler et al. | 118/723 X |
| 4,369,730 | 1/1983 | Izu et al. | 118/715 X |

FOREIGN PATENT DOCUMENTS

| 1157120 | 7/1969 | United Kingdom | 226/93 |
| 2083840 | 3/1982 | United Kingdom | 118/718 |

Primary Examiner—John D. Smith
Assistant Examiner—Bernard F. Plantz
Attorney, Agent, or Firm—Marvin S. Siskind

[57] ABSTRACT

An apparatus for producing improved large area photovoltaic devices by substantially reducing the warpage of relatively large area, relatively thin webs of magnetic substrate material which travel through a plurality of high temperature, low pressure glow discharge deposition chambers. As the web of the substrate material moves through the deposition chambers, it assumes a normal, elongated path of travel. Due to the elevated deposition temperature, the elongated path of travel, the force of gravity, etc., the web has a tendency to warp. Warpage of the web is undesirable as it promotes the deposition of non-uniform semiconductor alloy layers. The improvement of the present invention contemplates the establishment of at least one magnetic field within each deposition chamber which is adapted to urge the web of substrate material out of its normal path of travel into a flat, substantially planar path of travel. The new flat path of travel serves to substantially reduce warpage of the web which permits uniform amorphous semiconductor alloy layers to be deposited. In alternate embodiments, the web of substrate material may be urged into sliding contact with a plurality of stationary ceramic magnets or the web may be urged into rolling contact with a plurality of rotatable magnetic elements which may either be hollow, ceramic magnets or electromagnets.

9 Claims, 7 Drawing Figures

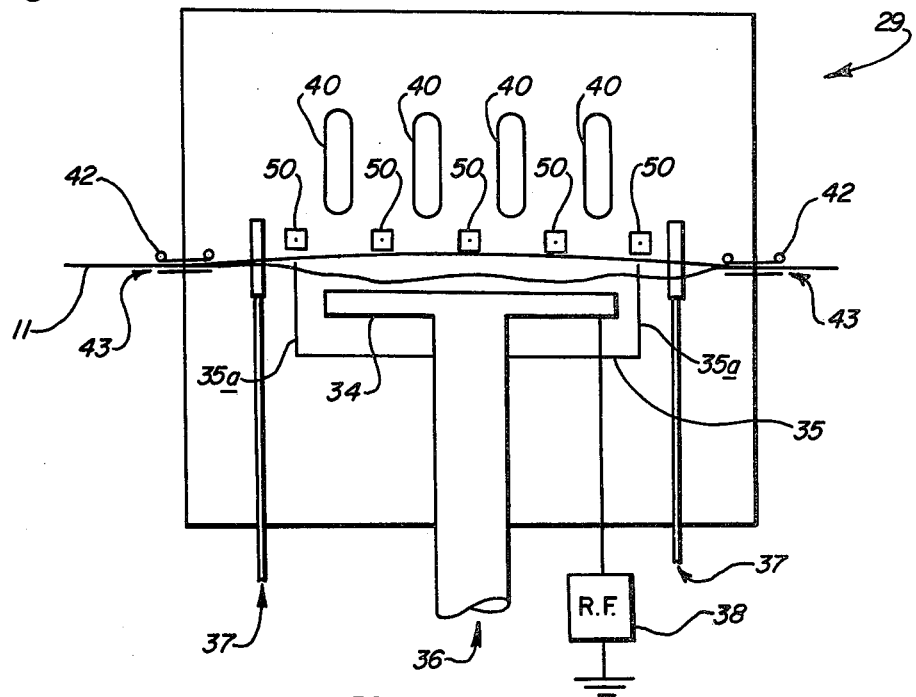
FIG. 3
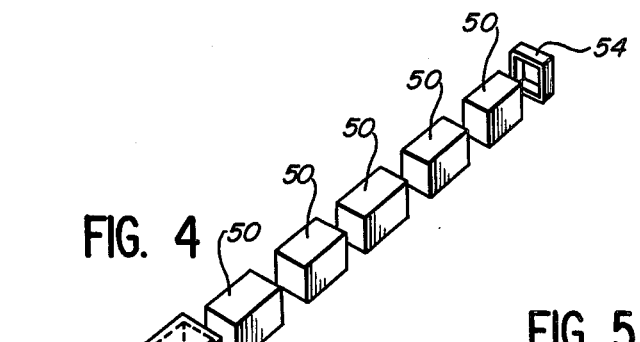
FIG. 4
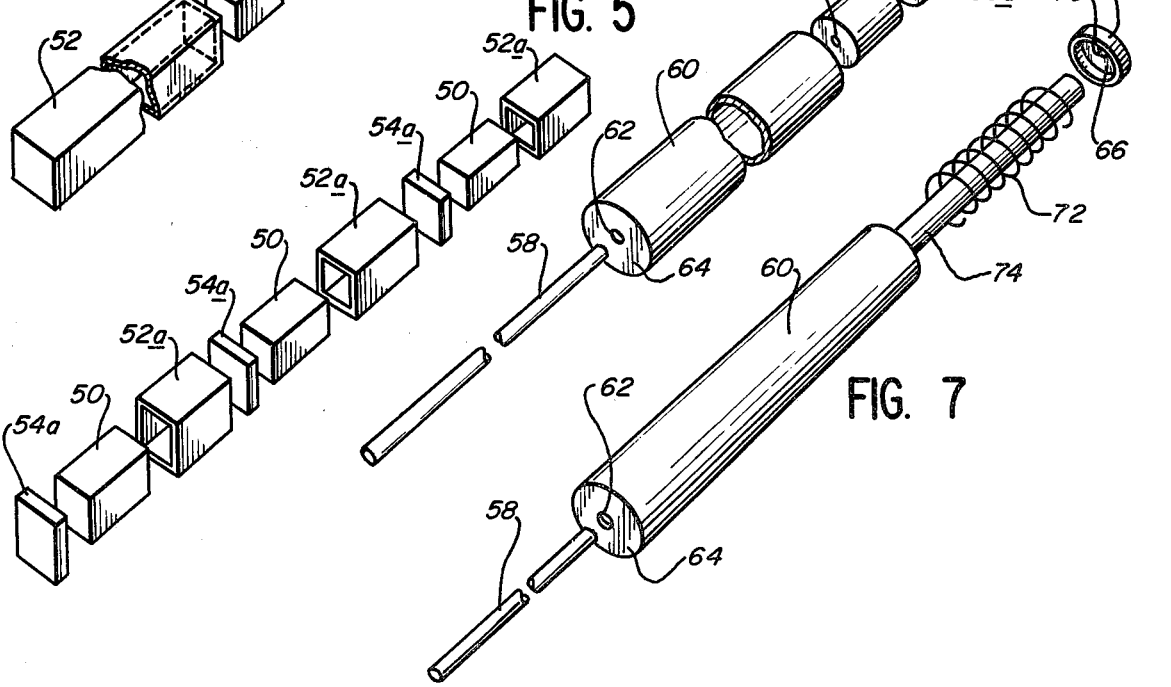
FIG. 5
FIG. 6
FIG. 7

MAGNETIC APPARATUS FOR REDUCING SUBSTRATE WARPAGE

FIELD OF THE INVENTION

This invention relates generally to apparatus for producing improved photovoltaic devices and more particularly to apparatus adapted to substantially reduce warping of a magnetic web of substrate material so as to produce more efficient large area photovoltaic cells.

BACKGROUND OF THE INVENTION

The present invention relates to apparatus for substantially reducing warpage of relatively large area, relatively thin webs of substrate material onto which amorphous silicon alloy layers are deposited by continuous glow discharge production techniques performed within dedicated deposition chambers. More particularly, in the continuous production glow discharge deposition apparatus of the prior art, the web of substrate material is moved, under tension, from a supply core through a plurality of deposition chambers wherein successive amorphous alloy layers are deposited. While moving through the plurality of deposition chambers and onto a take-up core, the web of substrate material assumes a normal, elongated path of travel. Due, inter alia, to (1) the elevated temperature required for the deposition of amorphous semiconductor alloy layers onto the web, (2) the gravitational forces acting on the web, (3) the normal elongated path of travel through the deposition chambers which the web follows, and (4) stress on the web, itself, the web of substrate material experiences longitudinal and transverse warpage. The apparatus of the present invention is adapted to establish a plurality of substantially equally spaced magnetic fields within each of the plurality of deposition chambers for urging the web of substrate material out of its normal, sagging elongated path of travel through the plurality of deposition chambers and into a substantially planar path of travel. In this manner, the web of substrate material is "flattened" so as to provide a substantially planar deposition surface onto which uniform amorphous alloy layers may be deposited. The result is the production of improved, more efficient large area photovoltaic devices.

Recently, considerable efforts have been made to develop processes for depositing amorphous semiconductor alloys, each of which can encompass relatively large areas, and which can be doped to form p-type and n-type materials for the production of p-i-n-type devices, which are, in operation, substantially equivalent to their crystalline semiconductor counterparts. For many years such work with amorphous silicon or germanium films was substantially unproductive because of the presence therein of microvoids and dangling bonds which produce a high density of localized states in the energy gap. Initially, the reduction of the localized states was accomplished by glow discharge deposition of amorphous silicon films wherein silane ($SiH_4$) gas is passed through a reaction tube where the gas is decomposed by a radio frequency (r.f.) glow discharge and deposited on a substrate at a substrate temperature of about 500-600 degrees K. (227-327 degrees C.). The material so deposited on the substrate is an intrinsic amorphous material consisting of silicon and hydrogen. To produce a doped amorphous material, phosphine gas ($PH_3$), for n-type conduction, or diborane ($B_2H_6$) gas, of p-type conduction is premixed with the silane gas and passed through the glow discharge reaction tube under the same operating conditions. The material so deposited includes supposedly substitutional phosphorus or boron dopants and is shown to be extrinsic and of n or p conduction type. The hydrogen in the silane was found to combine, at an optimum temperature, with many of the dangling bonds of the silicon during the glow discharge deposition to reduce the density of the localized states in the energy gap, thereby causing the amorphous material to more nearly approximate the corresponding crystalline material.

It is now possible to prepare greatly improved amorphous silicon alloys, that have significantly reduced concentrations of localized states in the energy gaps thereof, while providing high quality electronic properties by glow discharge. This technique is fully described in U.S. Pat. No. 4,226,898, Amorphous Semiconductors Equivalent to Crystalline Semiconductors, Stanford R. Ovshinsky and Arun Madan which issued Oct. 7, 1980 and by vapor deposition as fully described in U.S. Pat. No. 4,217,374, Stanford R. Ovshinsky and Masatsugu Izu, which issued on Aug. 12, 1980, under the same title. As disclosed in these patents, fluorine introduced into the amorphous silicon semiconductor operates to substantially reduce the density of the localized states therein and facilitates the addition of other alloying materials, such as germanium.

Activated fluorine readily diffuses into, and bonds to, amorphous silicon in a matrix body to substantially decrease the density of localized defect states therein. This is because the small size of the fluorine atoms enables them to be readily introduced into an amorphous silicon matrix. The fluorine bonds to the dangling bonds of the silicon and forms a partially ionic stable bond with flexible bonding angles, which results in more stable and more efficient compensation or alteration than could be formed by hydrogen, or other compensating or altering agents which were previously employed. Fluorine is considered to be a more efficient compensating or altering element than hydrogen when employed alone or with hydrogen, because of its exceedingly small size, high reactivity, specificity in chemical bonding, and high electronegativity.

Compensation may be achieved with fluorine, alone or in combination with hydrogen, upon the addition of such element(s) in very small quantities (e.g., fractions of one atomic percent). However, the amounts of fluorine and hydrogen must desirably used are much greater than such small percentages, permitting the elements to form a silicon-hydrogen-fluorine alloy. Thus, alloying amounts of fluorine and hydrogen may, for example, be used in a range of 0.1 to 5 percent or greater. The alloy thus formed has a lower density of defect states in the energy gap than can be achieved by the mere neutralization of dangling bonds and similar defects states. In particular, it appears that use of larger amounts of fluorine participates substantially in effecting a new structural configuration of an amorphous silicon-containing material and facilitates the addition of other alloying materials, such as germanium. Fluorine, in addition to the aforementioned characteristics, is an organizer of local structure in the silicon-containing alloy through inductive and ionic effects. Fluorine, also influences the bonding of hydrogen by acting to decrease the density of the defect states which hydrogen normally contributes. The ionic role that fluorine plays in such an alloy is an important factor in terms of the nearest neighbor relationships.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to utilizing different band gap devices to more efficiently collect various portions of the solar spectrum and to increase open circuit voltage (Voc). The tandem cell device has two or more cells with the light directed serially through each cell, with a large band gap material followed by a smaller band gap material to absorb the light passed through the first cell or layer. By substantially matching the generated currents from each cell, the overall open circuit voltage is increased without substantially decreasing the short circuit current.

Many publications on crystalline stacked cells following Jackson have been reported and, more recently, several articles dealing with Si-H materials in stacked cells have been published. Marfaing proposed utilizing silane deposited amorphous Si-Ge alloys in stacked cells, but did not report the feasibility of doing so. (Y. Marfaing, Proc. 2nd European) Communities Photovoltaic Solar Energy Conf., Berlin, West Germany, p. 287, (1979).

Hamakawa et al., reported the feasibility of utilizing Si-H in a configuration which will be defined herein as a cascade type multiple cell. The cascade cell is hereinafter referred to as a multiple cell without a separation or insulating layer therebetween. Each of the cells was made of an Si-H material of the same band gap in a p-i-n junction configuration. Matching of the short circuit current ($J_{sc}$) was attempted by increasing the thickness of the cells in the serial light path. As expected, the overall open circuit voltage (Voc) of the device increased and was proportional to the number of cells utilized.

Due to the beneficial properties attained by the introduction of fluorine, amorphous alloys used to produce cascade type multiple cells now incorporate fluorine to reduce the density of localized states without impairing the electronic properties of the material. Further band gap adjusting element(s), such as germanium and carbon, can be activated and are added in vapor deposition, sputtering or glow discharge processes. The band gap is adjusted as required for specific device applications by introducing the necessary amounts of one or more of the adjusting elements into the deposited alloy cells in at least the photocurrent generation region thereof. Since the band gap adjusting element(s) has been tailored into the cells without adding substantial deleterious states, because of the influence of fluorine, the cell alloy maintains high electronic qualities and photoconductivity when the adjusting element(s) are added to tailor the device wavelength characteristics for a specific photoresponse application. The addition of hydrogen, either with fluorine or after deposition, can further enhance the fluorine compensated or altered alloy. The post deposition incorporation of hydrogen is advantageous when it is desired to utilize the higher deposition substrate temperatures allowed by fluorine.

It is of obvious commercial importance to be able to mass produce photovoltaic devices. Unlike crystalline silicon which is limited to batch processing for the manufacture of solar cells, amorphous silicon alloys can be deposited in multiple layers over relatively large area substrates to form solar cells in a high volume, continuous processing system. Continuous processing systems of this kind are disclosed, for example, in pending patent applications: Ser. No. 151,301, filed May 19, 1980 for A Method of Making P-Doped Silicon Films and Devices Made Therefrom; Ser. No. 244,386, filed Mar. 16, 1981 for Continuous Systems For Depositing Amorphous Semiconductor Material; Ser. No. 240,493, filed Mar. 16, 1981 for Continuous Amorphous Solar Cell Production System; Ser. No. 306,146, filed Sept. 28, 1981 for Multiple Chamber Deposition and Isolation System and Method; and Ser. No. 359,825, filed Mar. 19, 1982 for Method and Apparatus For Continuously Producing Tandem Photovoltaic Cells.

As disclosed in these applications, a web of substrate material may be continuously advanced through a succession of deposition chambers, wherein each chamber is dedicated to the glow discharge deposition of a specific amorphous semiconductor alloy material. In making a solar cell of p-i-n-type configuration, the first chamber is dedicated for depositing a p-type amorphous silicon alloy layer onto the substrate, the second chamber is dedicated for depositing an intrinsic amorphous silicon alloy layer atop the p-type layer, and the third chamber is dedicated for depositing an n-type amorphous silicon alloy layer atop the intrinsic layer. In order to deposit amorphous semiconductor alloy layers which will produce efficient photovoltaic devices, it is necessary that each one of the alloy layers be of substantially uniform thickness. It has been determined that the deposition apparatus of the prior art is unable to prevent (1) transverse warping (warping may synonymously be termed buckling or canoeing) of the web of substrate material caused by the force of gravity acting on the substrate, the elongated path of travel which the substrate follows, stresses on the web, itself, the high deposition temperatures to which the substrate is continuously subjected; or (2) longitudinal warping of the web of substrate material which occurs when the tension on the substrate initiated by drive and tensioning motors is not very carefully adjusted. When the substrate warps, peaks and valleys are formed. It is common to have greater thicknesses of amorphous alloy materials deposited in the valleys while none or lesser thicknesses of amorphous alloy materials are deposited at the peaks. Such non-uniform deposition of the amorphous semiconductor alloy layers is undesirable, can create short circuits and generally serves to impair efficiency and operation of the large area photovoltaic devices produced therefrom.

One method of increasing the efficiency of photovoltaic cells produced on relatively large area, relatively thin, elongated webs of substrate material is to eliminate or substantially reduce transverse and longitudinal warpage of webs of substrate material traveling through the deposition chambers. It is to this end that the apparatus of the present invention is directed. More particularly, the present invention contemplates the establishment in each deposition chamber of at least one magnetic field for flattening the web by urging the web into a substantially planar configuration. This is accomplished by moving the magnetic web of substrate material out of its normal elongated path of travel through each of the deposition chambers. The flattening of the web created by the magnetic fields permits substantially uniform amorphous semiconductor alloy layers to be deposited onto the web of substrate material and hence increases the overall efficiency of the large area photovoltaic devices.

These and other objects and advantages of the present invention will become clear from the drawings, the detailed description of the invention and the claims which follow.

BRIEF SUMMARY OF THE INVENTION

Disclosed herein is an apparatus for producing improved large area photovoltaic devices by substantially reducing the warpage which occurs to relatively large area, relatively thin webs of magnetic substrate material traveling through a plurality of high temperature, low pressure deposition chambers in each of which an amorphous semiconductor alloy layer is deposited. In the mass production machine, the web of substrate material moves from a supply roller, under tension, through the series of deposition chambers and is finally wound onto a take-up roller. As the web of substrate material moves through the deposition chambers, it assumes a normal elongated path of travel. Due to factors such as the elevated deposition temperatures, the elongated path of travel of the substrate, stresses on the substrate, uneven temperature distribution across the substrate and the force of gravity on the substrate, the web of substrate material has a tendency to warp. As previously explained, warpage is undesirable as it promotes the deposition of non-uniform semiconductor alloy layers onto the web of substrate material. The improvement of the present invention contemplates the establishment of at least one magnetic field within each deposition chamber which is adapted to urge the web out of its normal sagging path of travel and into a substantially planar path of travel, thereby substantially reducing warpage. In this manner, uniform amorphous semiconductor alloy layers may be deposited onto one surface of the flattened web of substrate material. In one preferred embodiment, the web of substrate material is urged upwardly out of its normal path of travel by a plurality of substantially equally spaced rows of ceramic magents, each of which extends substantially across the entire transverse width of the web of substrate material. A plurality of elongated, hollow tubes may be provided to receive therein the ceramic magnets of each of the plurality of rows. The length of each of the magnetic assemblies substantially coincides with the transverse width of the magnetic web of substrate material. Also in the preferred embodiment, the number of tubes is sufficient to equally space the tubes at approximately eight to ten inch intervals along the longitudinal extent of each of the deposition chambers.

In an alternative preferred embodiment of the present invention, the web of substrate material is urged upwardly into the generally planar path of travel by a plurality of rotatable magnetic elements. In this embodiment, the unlayered surface of the magnetic web of substrate material is urged into rolling contact with the magnetic elements so as to not only increase the tension and produce a flat deposition surface on the web of substrate material, but also to reduce frictional contact between the unlayered surface of the magnetic web of substrate material and the magnetic elements. The reduction of surface friction becomes increasingly important as the length of the path of travel of the substrate through the deposition chambers increases. As should be readily apparent, in the mass production machine in which a plurality of deposition chambers are required to produce a plurality of p-i-n-type photovoltaic cells, the web of substrate material assumes a very lengthy path of travel. Since it is undesirable to provide drive motors of great power to overcome the stationary magnetic forces acting on the web, the rotatably magnetic elements become increasingly important. In the friction reducing embodiment, the magnetic elements are rotatably supported within each one of the deposition chambers so as to extend substantially across the entire transverse width of the magnetic web of substrate material. The magnetic elements may either be a plurality of ceramic magnets having a circular periphery rotatably mounted on an axle and encapsulated by a hollow tube, or may be an electromagnetic coil rotatably disposed about an axle and encapsulated by a tube. Despite the configuration of the magnetic field, the preferred embodiment contemplates the establishment of magnetic fields about every eight to ten inches along the longitudinal extent of the deposition chambers so as to reduce warpage by flattening the magnetic web of substrate material.

BRIEF DESCRIPTION OF THE DRAWINGS

FIG. 3 is an enlarged, diagrammatic representation of a single examplary deposition chamber of the multiple glow discharge chamber deposition system shown in FIG. 2 and particularly illustrating the disposition of the magnetic field forming elements of one embodiment of the present invention;

FIG. 4 is an enlarged, exploded, perspective view of one preferred embodiment of the present invention wherein rectangularly shaped ceramic magnets are encapsulated by a single elongated hollow tube adapted to be attached to a deposition chamber such as the one shown in FIG. 3;

FIG. 5 is an enlarged, exploded perspective view of a second preferred embodiment of the present invention, similar to FIG. 4, but in which each of the rectangularly shaped magnetic elements are encapsulated by one hollow tube;

FIG. 6 is an enlarged, exploded perspective view of another preferred embodiment of the present invention wherein rotatably mounted, tubular magnets are encapsulated by an elongated hollow tube and adapted to be rotatably secured by an axle within a deposition chamber such as shown in FIG. 3;

FIG. 7 is an enlarged, exploded perspective view of yet a further preferred embodiment of the present invention wherein electrical coils are wound about an axle and encapsulated by an elongated hollow tube which is adapted to be rotationally secured within a deposition chamber such as shown in FIG. 3.

DETAILED DESCRIPTION OF THE DRAWINGS

I. The Photovoltaic Cell

Figure 1:
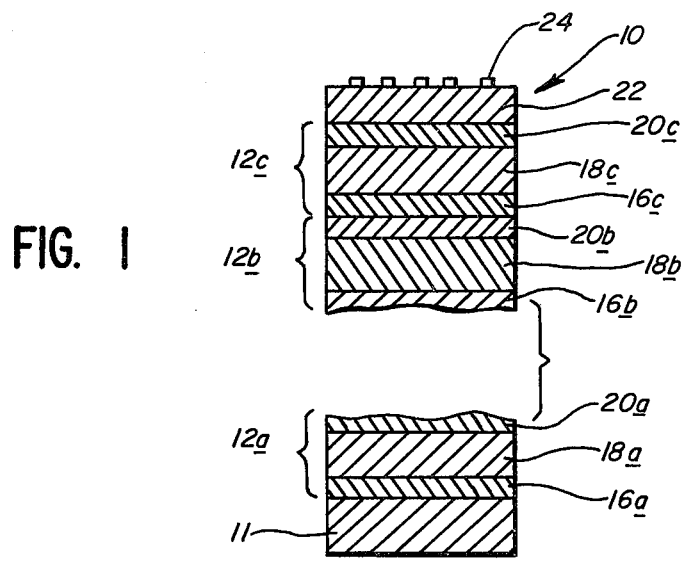
FIG. 1 is a fragmentary cross-sectional view of a tandem photovoltaic device comprising a plurality of p-i-n-type cells, each layer of the cells formed from an amorphous, semiconductor alloy.

Referring now to the drawings and particularly to FIG. 1, a tandem or cascade-type photovoltaic cell, formed of successive p-i-n layers each including an amorphous semiconductor alloy, is shown generally by the numberal 10. It is for the mass production of this type of photovoltaic device, wherein amorphous alloy layers are continuously deposited onto a moving web of substrate material in successive isolated triads of deposition chambers that the apparatus of the present invention for substantially reducing warpage of the web of substrate material was developed.

More particularly, FIG. 1 shows a plurality of p-i-n-type photovoltaic devices such as solar cells 12a, 12b and 12c. Below the lowermost cell 12a is a substrate 11 which may be transparent or formed from a metallic surfaced foil. Although certain applications may require a thin oxide layer and/or a series of base contacts prior to application of the amorphous material, for purposes of this application, the term "substrate" shall include not only a flexible film, but also any elements added thereto by preliminary processing. Most commonly the substrate material 11 may be stainless steel, aluminum, tantalum, molybdenum or chrome.

Each of the cells 12a, 12b and 12c are fabricated with an amorphous alloy body containing at least a silicon alloy. Each of the alloy bodies includes an n-type conductivity region or layer 20a, 20b and 20c; an intrinsic region or layer 18a, 18b and 18c; and a p-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although tandem p-i-n cells are illustrated, the substrate warpage reduction apparatus of this invention is utilized equally well in (1) multiple chamber apparatus which is adapted to produce tandem n-i-p cells or in (2) multiple chamber apparatus which is adapted to produce Schottky or MIS cells. In other words, the present invention may be utilized with any apparatus wherein warpage of large area substrates is a problem.

For each of the cells 12a, 12b and 12c, the p-type layers are characterized by light absorptive, high conductivity alloy layers. The intrinsic alloy layers are characterized by an adjusted wavelength threshold for solar photoresponse, high light absorption, low dark conductivity and high photoconductivity, including sufficient amounts of a band gap adjusting element or elements to optimize the band gap for the particular cell application. Preferably, the intrinsic layers are band gap adjusted to provide cell 12a with the smallest band gap, cell 12c with the largest band gap, and cell 12b with a band gap between the other two. The n-type layers are characterized by low light absorption, high conductivity alloy layers. The thickness of the n-type layers can be in the range of about 25 to 100 angstroms. The thickness of the band gap adjusted, amorphous intrinsic alloy layers can be between about 2,000 to 3,000 angstroms. The thickness of p-type layers can be between 50 to 200 angstroms. Due to the shorter diffusion length of the holes, the p-type layers generally will be as thin as possible. Further, the outermost layer, here the n-type layer 20c, will be as thin as possible to avoid absorption of light and need not include the band gap adjusting element.

It is to be understood that following the deposition of the amorphous semiconductor alloy layers, a further deposition step may be performed in a separate environment. In this step, a TCO (transparent conductive oxide) layer 22 is added, which layer may, for example, be indium tin oxide (ITO), cadmium stannate ($Cd_2SnO_4$), or doped tin oxide ($SnO_2$). Although an electrode grid 24 may be added to the device, for a tandem cell having a sufficiently small area, the TCO layer 22 is generally sufficiently conductive so the grid 24 is not necessary. If the tandem cell is of a sufficiently large area, or if the conductivity of the TCO layer 22 is insufficient, the grid 24 may be placed on the layer 22 to shorten the carrier path and increase the conduction efficiency thereof.

II. The Multiple Glow Discharge Deposition Chambers

Figure 2:
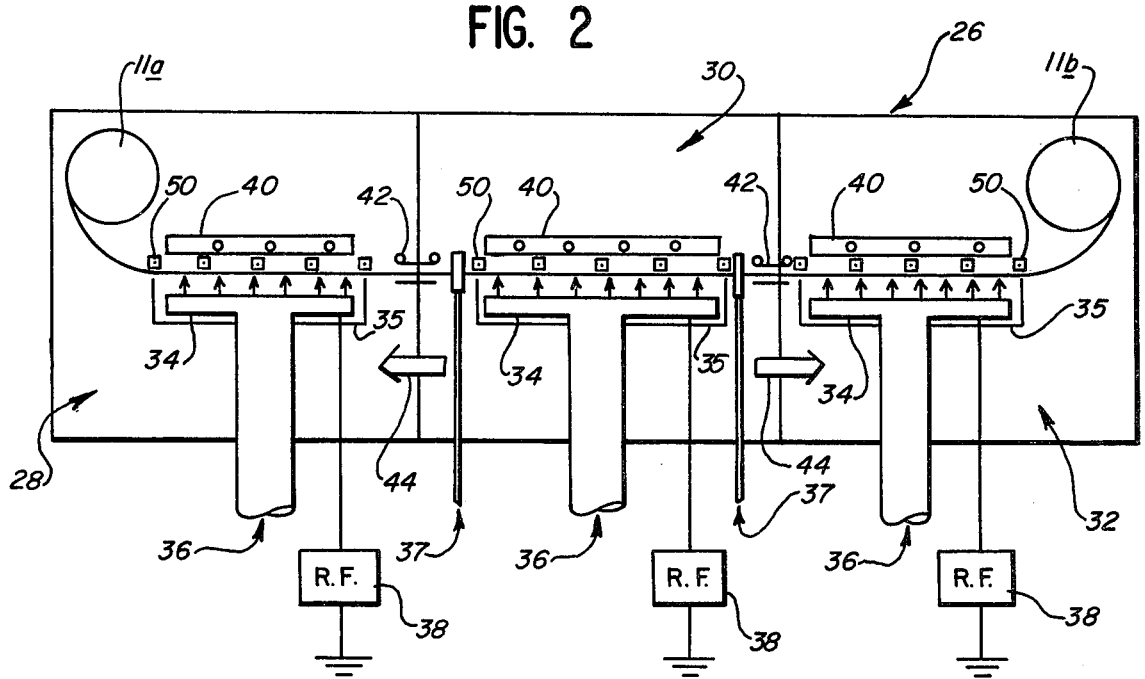
FIG. 2 is a diagrammatic representation of a multiple glow discharge chamber deposition system adapted for the continuous production of the photovoltaic devices shown in FIG. 1.

Turning now to FIG. 2, a diagrammatic representation of multiple glow discharge chamber deposition apparatus for the continuous production of the tandem photovoltaic cells, previously described with reference to FIG. 1, is generally illustrated by the reference numberal 26. The apparatus 26 includes a plurality of isolated, dedicated deposition chambers 28, 30 and 32, adjacent chambers being operatively interconnected by a gas gate 42.

The apparatus 26 is adapted to produce a high volume of large area, amorphous photovoltaic cells having a p-i-n configuration on the deposition surface of a web of substrate material 11 which is continually fed therethrough. To deposit the amorphous alloy layers required for producing a tandem cell of the p-i-n configuration, the apparatus 26 includes at least one triad of deposition chambers, each triad comprising: a first deposition chamber 28 in which a p-type conductivity amorphous alloy layer is deposited onto the deposition surface of the web of substrate material 11 as the web of substrate material 11 passes therethrough; a second deposition chamber 30 in which an intrinsic amorphous alloy layer is deposited atop the p-type alloy layer on the deposition surface of the web of substrate material 11 as the web of substrate material 11 passes therethrough; and a third deposition chamber 32 in which an n-type conductivity alloy layer is deposited atop the intrinsic layer on the deposition surface of the web of substrate material 11 as the web of substrate material 11 passes therethrough.

It should be apparent that: (1) although one triad of deposition chambers has been described, additional triads or additional individual chambers may be added to the machine to provide the machine with the capability of producing photovoltaic cells having any number of amorphous layers; and (2) the magnetic field forming apparatus of the present invention finds application in reducing warpage in any environment wherein an elongated, relatively thin, relatively large area web of substrate material assumes an elongated path of travel and in which warping of the web represents an undesirable characteristic. Thus, the present invention would be of particular value in any high temperature, low pressure process.

Where the apparatus 26 is employed to produce tandem p-i-n or n-i-p-type photovoltaic cells, additional triads of deposition chambers are operatively connected to the triad of deposition chambers shown in FIG. 2. In those instances, the apparatus 26 would further include an intermediate chamber (not shown) for isolating the n-type reaction gas mixture flowing through the third deposition chamber 32 and the p-type reaction gas mixture flowing through the first deposition chamber of the succeeding triad.

Each deposition chamber 28, 30 and 32 of the triad is adapted to deposit a single amorphous silicon alloy, by glow discharge deposition onto the web of substrate material 11. To that end, each of the deposition chambers 28, 30 and 32 includes: a cathode 34; a shield 35 disposed to surround three sides of each of the cathodes 34; a gas supply conduit 36; an inert sweep gas conduit 37 disposed on opposed sides of the intrinsic deposition chamber; a radio frequency generator 38; a plurality of radiant heating elements shown schematically as 40 in FIG. 2; and a gas gate 42 separating each of the deposition chambers.

The supply conduits 36 are operatively associated with the respective cathodes 34 to deliver reaction gas mixtures to the plasma regions created in each deposition chamber 28, 30 and 32 between said cathodes 34, the cathode shields 35 and the substrate 11 traveling therepast. The cathode shields 35 operate in conjunction with the web of substrate material 11 to substantially confine the plasma within the cathode region of the deposition chambers. Althouh the supply core 11a for the web of substrate material 11 is shown rotatably positioned in the first deposition chamber 28 and the take-up core 11b for the web of substrate material is shown rotatably positioned in the third deposition chamber 32, it is to be understood that the supply core 11a and take-up core 11b are preferably positioned in other chambers operatively connected to the illustrated triad of chambers without departing from the spirit or scope of the present invention.

The radio frequency generators 38 operate in conjunction with the cathodes 34, the radiant heaters 40 and the grounded substrate 11 to form the plasma regions by dissociating the elemental reaction gases entering the deposition chambers 28, 30 and 32 into deposition species. The deposition species are then deposited onto the web of substrate material 11 as amorphous silicon alloy layers.

To form the photovoltaic cell 10 illustrated in FIG. 1, a p-type amorphous silicon layer is deposited onto the web of substrate material 11 in the deposition chamber 28, an intrinsic amorphous silicon alloy layer is deposited atop the p-type layer in the deposition chamber 30 and an n-type amorphous silicon alloy layer is deposited atop the intrinsic layer in the deposition chamber 32. As a result, the apparatus 26, deposits at least three amorphous silicon alloy layers onto the web of substrate material 11 wherein the intrinsic layer deposited in deposition chamber 30 differs in composition from the layers deposited in deposition chambers 28 and 32 by the substantial absence of at least one element which will be referred to as the dopant or doing species.

It is important that each one of the amorphous alloy layers deposited onto the substrate 11 be (1) of high purity, and (2) of substantially uniform thickness in order to produce photovoltaic devices 10 of high efficiency. One step in achieving pure layers is to substantially isolate the intinsic deposition chamber 30, which has introduced thereinto only intrinsic gases for forming the intrinsic alloy layer, from the dopant deposition chambers 28 and 32 wherein the doping species gases are introduced. Although the isolation must be sufficient to provide a ratio of at least $10^3$ in the concentration of the intrinsic gases in the deposition chamber 30 to the doping species gases in the dopant deposition chamber 28 and 32, an even greater degree of isolation, produces cells of even higher efficiencies. The use of magnetic gas gates, such as 42 disclosed in a commonly assigned and pending patent application Ser. No. 372,937, filed Apr. 29, 1982, and entitled "Magnetic Gas Gate", enables the apparatus to substantially reduce contamination by reducing the size of the opening through which the substrate passes. However, as the size of the opening is reduced, warpage of the substrate becomes more critical because the layered peaks of the warped substrate can contact and scrape against walls of the gas gate opening, thereby adversely effecting the operability of photovoltaic devices produced therefrom. It therefor becomes more necessary to control warpage of substrates within the deposition apparatus. Obviously, flattening of the web of substrate material not only allows uniform semiconductor layers to be deposited, but those semiconductor layers are not removed by scraping the gas gate opening walls.

III. Apparatus Establishing A Substrate Attracting Force

Referring now to FIG. 3, an enlarged diagrammatic view of an examplary one of the plurality of deposition chambers described hereinabove is illustrated by the reference numeral 29. As previously described, operatively disposed within the interior of the deposition chamber 29 is a cathode 34, a cathode shield 35, a power source 38, a supply conduit 36, oppositely disposed gas gates 42 and an inert sweep gas conduit 37 adjacent each gas gate 42. A plurality of elongated, equally spaced radiant heating elements 40 are disposed above and angled relative to the plane of the substrate 11 which assumes the normal path of travel indicated, in FIG. 3, by the undulating solid line. The angular disposition of the elongated heating elements 40, whereby the heating elements 42 are closest to the substrate 11 adjacent the central portion thereof, provides a uniform temperature distribution across the transverse width of the substrate 11. This concept is fully disclosed in a copending and commonly assigned patent application entitled "Apparatus For Uniformly Heating A Substrate".

The gas gates 42 provide relatively narrow passageways 43 operatively connecting adjacent deposition chambers such as chambers 28, 30 and 32 illustrated in FIG. 2, while substantially preventing contamination due to the backflow or diffusion of reaction gas constituents from the dopant deposition chambers 28 and 32 into the intrinsic chamber 30. In order to minimize back-diffusion from the dopant deposition chambers, and as described in the previously mentioned copending and commonly assigned patent application entitled "Magnetic Gas Gate": (1) an inert gas such as argon is introduced at the high pressure (intrinsic deposition chamber) side of the gas gates 42 so that the inert gas is drawn on both sides of the web of substrate material 11 into the low pressure dopant deposition chambers; and (2) a plurality of magnetic elements are employed in the gate to create a magnetic field which urges the unlayered surface of the magnetic web of substrate material 11 into sliding contact with one of the passageway walls. Since the unlayered surface of the substrate 11 is urged against one wall of the passageway 43, the height of the opening may be reduced without causing the layered surface of the substrate 11 to contact and be scratched by the opposite passageway wall. However, the reduced passageway opening, while making possible a substantial decrease in back-diffusion of dopant species into the intrinsic deposition chamber, does not prevent the web of substrate material from sagging (albiet a shallow sag) as it travels along its normal elongated path of travel. In this normal path of travel, the elongated web is at an uppermost elevation when passing through the gas gates 42 and at a lowermost elevation adjacent the center of the deposition chamber. Note that the shallow sag occurs despite the use of (1) a substrate moving motor driving the take-up core; (2) a substrate tensioning motor connected to the supply core; and (3) magnetic gas gates.

The shallow sag of the substrate traveling through the chambers is not, in and of itself, harmful to the final photovoltaic device produced by the apparatus. If the elevated temperatures to which the heating elements 42 raise the web of substrate material 11, the elongated path of travel of the web, the uneven temperature distribution across the web and the force of gravity did not combine to warp the substrate 11, the web flattening apparatus of the present invention would not be necessary. However, in view of the resulting transverse undulations 46 which are defined by the warped web of substrate material 11, it is posible that semiconductor alloy layers deposited thereon could be of relatively great thicknesses in the valleys and of relatively thin thicknesses on the peaks. Further, even if uniform layers could be deposited, the peaked portions of the warped web of substrate material could scrape against and be removed by the narrow walls of the gas gate passageway. Therefor, the efficiency and operation of photovoltaic devices produced from warped webs of substrate material 11 are likely to suffer. Hence, it is important to substantially reduce warpage of the web of substrate material. If warpage is reduced, the deposition of substantially uniform semiconductor layers which do not scrape against gas gate passageway walls will result. It is to this end that the present invention is directed.

With the foregoing in mind and referring to FIGS. 3-7, the attractive force for substantially flattening the web of substrate material 11 is established by a plurality of spaced magnets, generally 50. The magnets 50 are preferably fashioned from a ceramic material (such as $BaO-6Fe_2O_3$) because such ceramic materials are inherently lightweight, relatively inexpensive, stable at elevated temperatures and capable of creating strong magnetic fields. Although, the magnets 50 are illustrated in FIGS. 3-5 as one (1) inch wide by one (1) inch high by two (2) inch long rectangular bars, the magnets 50 are not limited (1) in dimension, (2) in configuration or (3) to a ceramic material. It is only necessary that the magnets 50 be capable of providing noncontaminating, strong substrate attractive forces at the elevated temperatures and low pressures required for the deposition of amorphous semiconductor alloy layers onto the magnetic web of substrate material 11.

FIG. 4 illustrates a first preferred embodiment of the present invention, wherein a plurality of the generally rectangular ceramic magnets 50 are adapted to be received within an elongated, generally rectangularly-shaped, relatively thin-walled hollow tube 52. The hollow tube 52 is adapted to extend substantially across the transverse width of the web of substrate material 11 and to be secured, by any well known mechanical equipment, to the opposite walls of the deposition chamber. The tube 52 provides a convenient mechanism (1) for "stringing" a plurality of commercially available sizes of ceramic magnets 50 across the transverse width of the web of substrate material, and (2) for encapsulating the magnets 50 to prevent contamination caused by outgassing when the magnets are cyclically heated and cooled. For a sixteen (16) inch wide web of substrate material, at least eight (8) of the two (2) inch long ceramic magnets 50 are inserted into a tube 52 which must therefor be at least sixteen (16) inches in length. An end cap 54 is used to seal the end of the tube 52 and complete the encapsulation. In order to develop a sufficiently strong attractive (magnetic) force, it has been determined that the encapsulated ceramic magnets 50 should be spaced at substantially equal, approximately eight (8) to ten (10) inch intervals along the entire longitudinal extent of the elongated path of travel of the web of substrate material 11 through each of the deposition chambers 29. By aligning a row of encapsulated magnets with each of the end walls 35a of the cathode shields 35, the magnets 50 offer the additional benefit of helping to confine the plasma to the cathode region. And in order to sufficiently flatten the web of substrate material 11, the encapsulated ceramic magnets 50 are disposed at a height above the normal elongated path of travel of the web of substrate material 11 (shown by the solid line in FIG. 3) of approximately one-eighth ($\frac{1}{8}$) inch adjacent the gas gates 42 and a height of approximately one-quarter ($\frac{1}{4}$) inch adjacent the center of the deposition chamber. With the aforementioned positioning of the magnetic assemblies, the magnetic web of substrate material 11 is urged, under the tension created by the magnetic field, out of its normal path of travel and into the flat, generally planar path of travel shown by the phantom line of FIG. 3. Because of the magnetic field, warpage is substantially reduced, thereby providing a flat surface onto which amorphous semiconductor layers of uniform thickness can be deposited.

FIG. 5 illustrates a second preferred embodiment of the instant invention wherein an individual, relatively short, generally rectangularly-shaped, relatively thin-walled, hollow tube 52a with a correspondingly shaped end cap 54a is provided to encapsulate each one of the ceramic magnets 50. The number of tube-magnet assemblies in each transverse row is, as described with respect to FIG. 4, sufficient to substantially extend across the transverse width of the web of substrate material 11. The number of rows of tube-magnet assemblies and their height above the web of substrate material 11 is also the same as the number of rows and height illustrated in FIG. 4 and discussed hereinabove.

FIGS. 6-7 depict further embodiments of the present invention which are specially adapted for use in those mass production machines having a plurality of p-i-n-type glow discharge deposition chambers in which the web of substrate material 11 follows a very lengthy path of travel. In the multiple chamber machine, it is undesirable to provide drive motors having high horsepower capabilities, when that high power is necessary for the sole purpose of overcoming the initial inertial and frictional forces created by the magnetic fields acting on the magnetic web of substrate material. To the end of alleviating high drive motor power requirements for multiple chamber machines outfitted with magnetic assemblies, it is an object of this embodiment of the present invention to rotatably mount the magnetic assemblies within the deposition chambers so that the web of substrate material is urged into rolling contact, rather than sliding contact, with those assemblies.

In the friction reducing embodiment of FIG. 6, the magnetic elements take the form of one or more axially apertured, generally cylindrically-shaped, ceramic magnets 50a. The axial aperture 56 is adapted to receive therein an elongated axle 58. An elongated, hollow, generally cylindrically-shaped tube 60, having an internal diameter approximately equal to the outer diameter of the cylindrical magnets 50a, is adapted to receive therein a plurality of those cylindrical magents 50a. The cylindrically-shaped tube 60 has an aperture 62 formed through the closed end 64 thereof and a corresponding aperture 70 formed through the end wall 66 of an end cap 68 which cooperates with the tube 60 to encapsulate the cylindrical magnets 50a. The length of the elongated tube 60 is approximately equal to the transverse width of the web of substrate material 11. The number of ceramic, cylindrical magnets received within the cylindrical tube 60 is dependent upon the length of each individual magnet, and must, preferably, provide an attractive field across the entire transverse width of the web of substrate material. As with the previously described embodiments, (1) a sufficient number of tubular assemblies should be provided to space said assemblies at eight to ten inch intervals along the length of each of the deposition chambers; and (2) the assemblies should be diposed at a height above the web of substrate material of approximately one-eighth inch adjacent the gas gates and one-quarter inch adjacent the center of the deposition chamber. With the cylindrical magnets 50a encapsulated within the tubes 60 and the axles 58 rotatably securing the tubes 60 and the magnets 50a, the tubes 60 are rotatably mounted within the deposition chamber 29. As the magnetic web of substrate material 11 is urged against the magnetic assemblies, said assemblies rotate about the axles 58, thereby reducing the force necessary to move the web through the deposition apparatus.

Referring now to FIG. 7, a final preferred embodiment of the present invention wherein the substrate-attracting force is established by rotatably mounted electromagnetic coils (the leads to the electrical power supply are not shown), illustrated by the reference numeral 72. Although the electromagnetic coils 72 are schematically shown wrapped about metal rod 74, it should be apparent that the axle 58a, itself, could be employed to develop the magnetic field. As previously described with respect to the magnets of FIG. 6, an elongated, cylindrically-shaped tube 60 and a correspondingly shaped end cap 68 (which includes an end wall 66 having an aperture 70 therethrough) are adapted to receive and encapsulate the electromagnetic assembly. An axle 58a slides through a bore 62 in the end wall 64 of the tube 60a, the rod 74 and the apertured end cap 66 before being rotatably mounted within the deposition chamber.

Regardless of the embodiment employed, it should now be appreciated that the apparatus of the present invention is adapted to substantially reduce warpage of webs of substrate material by establishing an attractive, web flattening force. The web is then provided with a generally planar surface, onto which uniform semiconductor layers may be deposited.

One final noteworthy point is that the creation of a magnetic field has no apparent deleterious affect on the deposition process. As a result, not only are the deposited layers more uniform than previously obtainable, but also, the semiconductor materials deposited by apparatus employing the magnetic assemblies disclosed herein are of the same high quality as the materials deposited by apparatus not equipped with the magnetic assemblies.

It should be understood that the present invention is not limited to the precise structure of the illustrated embodiments. It is intended that the foregoing description of the presently preferred embodiments be regarded as an illustration rather than as a limitation of the present invention. It is the claims which follow, including all equivalents, which are intended to define the scope of this invention.

We claim:

1. Apparatus for producing improved semiconductor devices by substantially reducing warpage of a relatively wide, elongated, relatively thin web of electrically conductive, magnetically attractable substrate material adapted to follow a normal elongaed path of travel through at least one isolated deposition chamber wherein a semiconductor alloy layer is deposited onto one surface of the substrate; the apparatus including, in combination:

a plurality of spaced magnets operatively disposed within the at least one deposition chamber for flattening the magnetically attractable web of substrate material, the magnets extending transversely across substantially the entire unlayered surface of the web to thereby create an attractive force which urges the web out of its normal path of travel and into a substantially planar path of travel through said at least one deposition chamber, whereby warpage of the web of substrate material is substantially reduced so that a uniform semiconductor alloy layer may be deposited onto the one surface of the web.

2. Apparatus as in claim 1, wherein the magnets are arranged to form a plurality of spaced rows of ceramic magents, each row extending substantially across the transverse width of the web of substrate material in each of said at least one deposition chamber.

3. Apparatus as in claim 2, further including means adapted to encapsulate the ceramic magnets of each of the equally spaced rows.

4. Apparatus as in claim 2, wherein the encapsulating means comprise a plurality of elongated tubes for receiving the ceramic magnets.

5. Apparatus as in claim 4, wherein each of the encapsulated rows of ceramic magnets are equally spaced at approximately eight to ten inch intervals in each of the at least one deposition chamber.

6. Apparatus as in claim 2, wherein the magnets are rotatably supported for urging the unlayered surface of the magnetic web of substrate material into rolling contact therewith so as to reduce frictional forces therebetween.

7. Apparatus as in claim 6, wherein each row of ceramic magnets is mounted on an axle rotatably affixed within each of the at least one deposition chamber.

8. Apparatus as in claim 7, further including at least one hollow tube adapted to encapsulate one of the at least one ceramic magnets mounted on each of the axles.

9. Apparatus as in claim 1, wherein the web of substrate material is formed of stainless steel, said stainless steel web of substrate material being greater than six inches wide.

* * * * *